(12) United States Patent
Johnson et al.

(10) Patent No.: US 8,754,612 B2
(45) Date of Patent: Jun. 17, 2014

(54) BATTERY GAS GAUGE RESET MECHANISM

(75) Inventors: Timothy M. Johnson, San Jose, CA (US); Scott Mullins, San Jose, CA (US); David John Tupman, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 8 days.

(21) Appl. No.: 13/544,840

(22) Filed: Jul. 9, 2012

(65) Prior Publication Data

US 2012/0275101 A1   Nov. 1, 2012

Related U.S. Application Data

(63) Continuation of application No. 12/330,156, filed on Dec. 8, 2008, now Pat. No. 8,232,771.

(51) Int. Cl.
*H02J 7/00* (2006.01)

(52) U.S. Cl.
USPC .......................................... 320/132

(58) Field of Classification Search
USPC .......................................... 320/139
See application file for complete search history.

(56) References Cited

U.S. PATENT DOCUMENTS

| | | | |
|---|---|---|---|
| 2001/0045355 A1 | 11/2001 | Gephart et al. | |
| 2004/0251394 A1 | 12/2004 | Rhodes et al. | |
| 2006/0125446 A1 | 6/2006 | Tupman et al. | |
| 2007/0108946 A1* | 5/2007 | Yamauchi et al. | 320/132 |
| 2007/0170893 A1* | 7/2007 | Kao et al. | 320/132 |
| 2007/0182377 A1* | 8/2007 | Vandensande | 320/132 |
| 2007/0188144 A1* | 8/2007 | Hara et al. | 320/132 |
| 2007/0188145 A1* | 8/2007 | Kim et al. | 320/132 |
| 2007/0188146 A1* | 8/2007 | Nakano et al. | 320/132 |
| 2007/0205830 A1 | 9/2007 | Itagaki et al. | |
| 2007/0236850 A1 | 10/2007 | Kuhn et al. | |
| 2008/0117922 A1 | 5/2008 | Cockrell et al. | |

OTHER PUBLICATIONS

Non-Final Office Action (dated Jun. 3, 2011), U.S. Appl. No. 12/330,156, filed Dec. 8, 2008, First Named Inventor: Timothy M. Johnson, (14 pages).
Final Office Action (dated Dec. 28, 2011), U.S. Appl. No. 12/330,156, filed Dec. 8, 2008, First Named Inventor: Timothy M. Johnson, (16 pages).
"bq27500 bq27501 System-Side Impedance Track™ Fuel Gauge", Texas Instruments, SLUS785D—Sep. 2007—Revised Apr. 2008, (30 pages).
"HDQ Communication Basics for TI's Battery Monitor ICs", Texas Instruments, Application Report, SLVA101—May 2001, (8 pages).
Vega, Michael, et al., "Single Cell Gas Gauge Circuit Design", Texas Instruments, Application Report, SLUA456—Mar. 2008, (6 pages).

* cited by examiner

*Primary Examiner* — Arun Williams
(74) *Attorney, Agent, or Firm* — Blakely, Sokoloff, Taylor & Zafman LLP (57) ABSTRACT

A gas gauge circuit has a power supply pin, a power return pin, power-on reset capability, and a communications signal pin. A reset control circuit is coupled between the power supply pin and the communications signal pin, or between the power return pin and the communications signal pin. The reset control circuit removes power to the gas gauge circuit in accordance with a control signal asserted on the communications signal pin. Other embodiments are also described and claimed.

17 Claims, 5 Drawing Sheets

BATTERY GAS GAUGE RESET MECHANISM

RELATED MATTERS

This application is a continuation of U.S. patent application Ser. No. 12/330,156, filed Dec. 8, 2008, entitled "Battery Gas Gauge Reset Mechanism", which issued as U.S. Pat. No. 8,232,771 on Jul. 31, 2012.

An embodiment of the invention is related to electronic mechanisms for monitoring the state of charge of the battery in a battery-operated computer system. Other embodiments are also described.

BACKGROUND

Battery-operated computer systems such as notebook personal computers, portable navigation devices, portable digital media players, and smart phones, have a need for technology that can automatically predict the remaining run time of the device, based on the current state of charge of its battery. To meet such a need, integrated circuit (IC) developers and manufacturers offer a battery fuel gauge circuit, also referred to as a gas gauge circuit. The basic gas gauge circuit may come in the form of a chip or IC package that is to be integrated in a host device, to be connected to the terminals of a battery pack of the device. The IC chip or package may be one that is integrated into the battery pack or is on a battery connector board, or it may be located directly on a main logic board of the device.

The gas gauge circuit contains various analog and digital circuitry needed to accurately measure battery voltage and/or battery current on an on-going basis (e.g., repeating such measurements every given time interval, as the device goes through its typical active and sleep usage cycles). This function is also referred to as a coulomb counter. The digital circuitry may include a microcontroller, i.e. a processor coupled to memory that stores instructions or software code to be executed by the processor. The microcontroller executes its programming, to measure or compute various parameters associated with usage of the battery as part of the device, such as cell voltage, average pack voltage, pack current, capacity change, battery impedance, open-circuit voltage, and others. It reports such information to a host controller, such as an application processor or power management unit of the host device, through a low overhead bus or interface such as a single wire HDQ serial data interface, a Smart Battery Specification, SBS, interface, or an I²C bus.

Some gas gauge circuits have a watchdog timer integrated in their designs. A watchdog timer monitors a specific periodic signal internal to the gas gauge and looks for its absence. Software running in the microcontroller of the gas gauge circuit is responsible for repeatedly acting (e.g., setting a particular bit of a register) to maintain this periodical signal. When the periodic signal stops, it is assumed that the gas gauge has "hung up" or entered a failure mode software loop. Thus, if the internal timer does not see a signal transition in a set amount of time, it will trigger a reset of the gas gauge (including its microcontroller).

In addition to the watch dog timer, the gas gauge circuit may also have power-on reset circuitry, which automatically resets the gas gauge when the supply voltage provided on its power supply pin cycles, by dropping to a sufficiently low level and then rising to a normal level. The supply voltage may drop to zero, for example when the battery pack has failed or has been removed from the device.

SUMMARY

As mentioned above, a gas gauge circuit may rely on an internal watchdog timer to ensure that its functionality can be reset, in the event the microcontroller of the gas gauge enters a failure mode software loop. This, however, may not provide sufficient protection against other potential failure modes of the microcontroller. In accordance with an embodiment of the invention, an external, reset control circuit is coupled between a power supply pin and a communications signal pin of the gas gauge, or between a power return pin and the communications signal pin. The reset control circuit automatically removes power to the gas gauge in accordance with an external control signal that has been asserted on the communications pin. The communications pin, which is normally used by the gas gauge to report its measured battery parameters to a host controller, is thus also used to respond to or implement a software based "hard reset" command from the host controller (which may be intended specifically for the gas gauge). The command results in cycling (off and then on) the external power applied to the gas gauge, thereby achieving a hard reset of the gas gauge, while the battery is powering the host device in the latter's normal course of operation. Various embodiments of the reset control circuit are described below.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Figure 1:
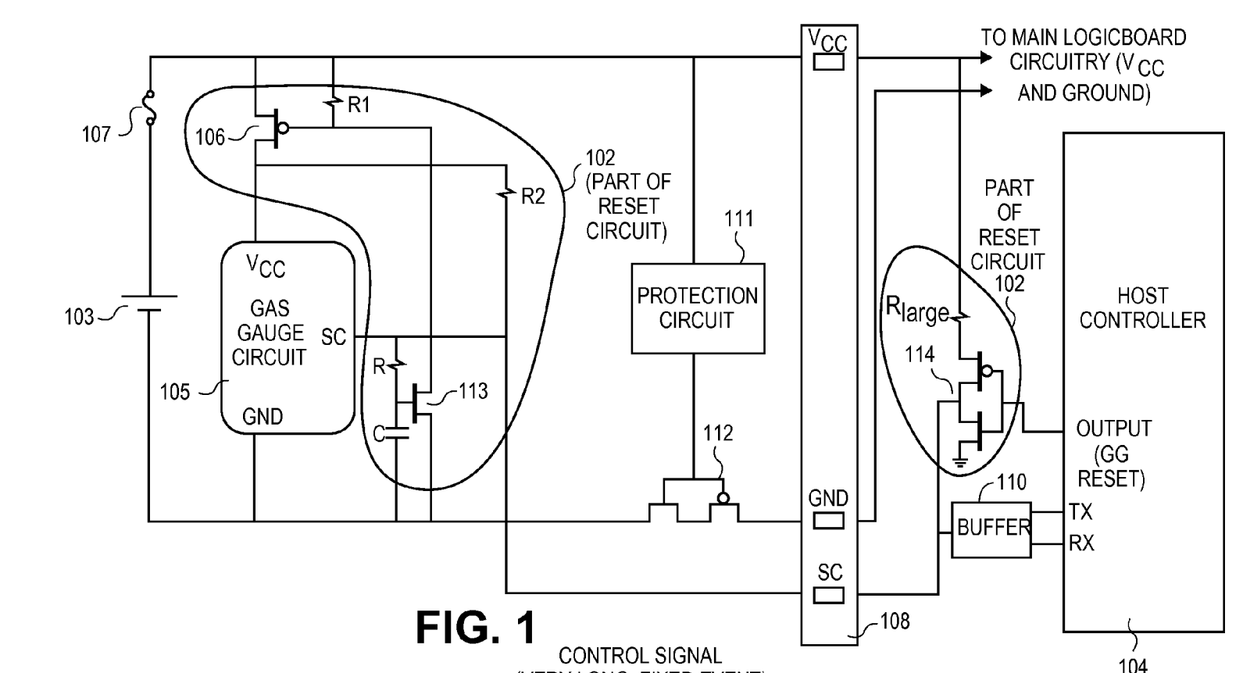
FIG. 1 is a circuit schematic of an embodiment of the gas gauge reset mechanism.
Figure 5:
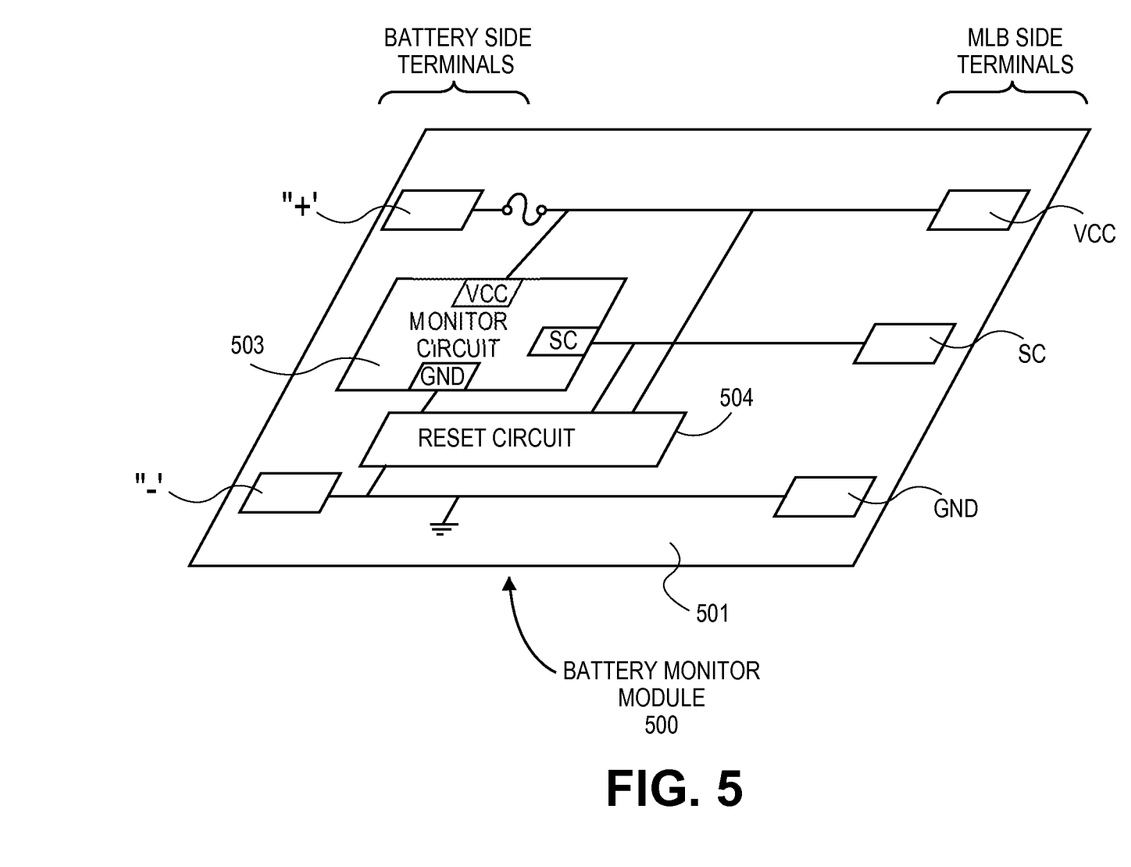
FIG. 5 is a circuit schematic of a battery monitor module having a reset mechanism.
Figure 6:
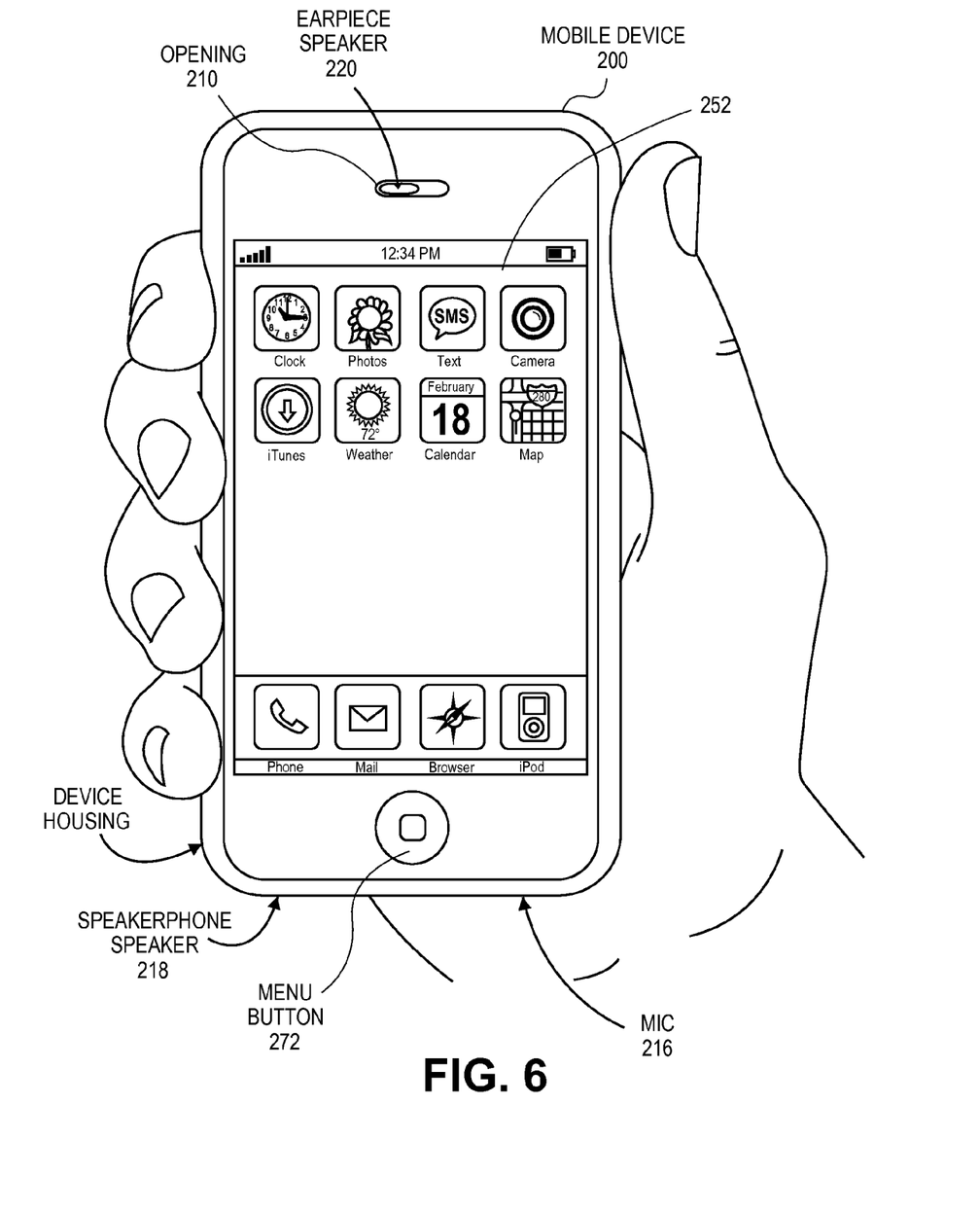
FIG. 6 shows an example battery-operated computer system being a smart phone in which various embodiments of the invention may be implemented.

FIG. 1 is a circuit schematic of an embodiment of the battery gas gauge reset mechanism. A reset circuit 102 is shown as incorporated in the interface between a battery 103 (that is to be monitored) and a host controller 104 that is embedded in a mobile device together with the battery 103. The host controller 103 may be a combination of a processor executing software in memory, such as a power management micro controller executing a power management routine in the mobile device. The term "battery" is used generically here as referring to the main rechargeable power source unit of the mobile device. FIG. 5 and FIG. 6 to be described below show an example of such a mobile device being a handheld smart phone. The reset circuit 102 may be incorporated into the host controller-battery interface of other types of mobile devices including, for example, laptop/notebook personal computers, portable digital media players, and portable navigation devices.

What is shown in FIG. 1 is an electronic circuit for monitoring the energy of the battery 103 while the latter is connected to power the mobile device. The circuit includes a gas gauge circuit 105 which performs as a fuel gauge for the battery 103. As explained above, the basic functions of a gas gauge circuit may include one or more of: measuring battery voltage and/or battery current on an ongoing basis; measuring battery temperature; and monitoring energy output of the battery and computing a measure of remaining energy in the battery, as the mobile device goes through its typical active and sleep usage cycles. Such functionality may be achieved by a processor and memory combination that is supported by various low level analog sensing circuitry, all of which may be within the gas gauge circuit 105. The gas gauge circuit 105 has a power supply pin Vcc that is coupled to the positive terminal of the battery 103 through a transistor 106 being, in this example circuit design, a P-channel field effect transistor (FET) being operated as a switch. A protection fuse 107 is included between a terminal of the battery 103 and the rest of the circuitry in the mobile device that is being powered by the battery 103. There is also a power return pin GND (ground) which is coupled in this example directly to the negative terminal of the battery 103.

Note that the term "pin" is being used in a general sense here as referring to an integrated circuit's external communications signal contact (for input or output purposes) or a power contact. This signal or power contact may be that of an IC package or chip carrier, such as the pin of a leaded or leadless IC package (e.g., a surface-mount IC package). Alternatively, "pin" may refer to a wire bonding or flip-chip pad or ball of an IC die or chip.

The gas gauge circuit 105 also has a communications signal pin SC to which part of the reset circuit 102 is coupled as shown. This is not a dedicated reset pin, but rather it is used primarily for sending battery parameter measurements out of the gas gauge circuit 105 (e.g., signaling a computed measure of remaining energy in the battery). Only occasionally is it used for implementing a hard reset of the gas gauge, as described in more detail below.

The gas gauge circuit 105 has power-on reset capability (POR capability), which refers to a hard reset capability that self initializes the circuit 105 in response to power being first applied to, or power being removed from and then reapplied to, the power supply and/or return pins of the circuit 105. Once POR has been initiated, several typical operations may be performed including initializing a program counter that governs the operation of a processor or controller within the gas gauge circuit 105, as well as initializing internal registers that are used by the processor (not shown).

Before describing details of the rest control circuit 102, various other aspects of the battery-host interface shown in FIG. 1 are described. In the example shown in FIG. 1, the gas gauge circuit 105 communicates with the host controller 104 through a serial communications line SC that traverses a battery connector 108. The SC line may be part of a single wire interface (SWI) or other low overhead bus or interface such as any of those introduced above in the Background section. More generally, the SC line may support a serial communications data, clock, or control signal between the gas gauge circuit 105 and an input or output pin of the host controller 104. In this example, the SC line is used bi-directionally, and for both data and control signals. At the host controller 104, the SC line terminates into a buffer circuit 110 which allows the single SC line to be shared by both transmit TX and receive RX pins of the host controller. Alternatively, the SC line may terminate directly into a bi-directional pin of the host controller.

In addition to the SC line, the battery connector 108 may also support a Vcc line and a GND or ground line, the latter pair being used to supply power to the main logic board circuitry of the mobile device.

Still referring to FIG. 1, with certain types of batteries, a protection circuit 111 may be needed to, for example, detect when the battery voltage has dropped to such a low level that the battery 103 should be disconnected from the main logic board so as not to further discharge the battery. For example, with lithium ion chemistries, the open circuit cell voltage of a battery should not be allowed to drop below a lower limit else damage will result to the battery. Accordingly, the protection circuit 111 is able to detect such a threshold in the battery voltage (by virtue of it being connected across the battery terminals as shown), and will open the transistor switch 112, which in this example is on the GND line, thereby disconnecting the battery 103 from the main logic board. The protection circuit 111 may be on the battery side of the connector 108 as shown. A further protection circuit (not shown) may be added that automatically disconnects power to the gas gauge circuit when the battery voltage is too low (e.g., by blocking current into the Vcc pin or out of the GND pin), to prevent the battery from discharging further due to leakage or due to normal operation of the gas gauge circuit.

Turning now to the reset control circuit 102, in the example of FIG. 1, the circuit 102 is coupled between the power supply pin Vcc of the gas gauge circuit 105 and the latter's communication signal pin SC. In this example, the reset circuit 102 is external to the gas gauge circuit 105, rather than being monolithically integrated with the analog and digital circuitry of the latter which perform the fuel gauge or battery monitoring functions. In an alternative embodiment, parts of the reset circuit 102 may be integrated within the gas gauge circuit 105, thus being deemed in that case internal to the circuit 105. The circuit 102 includes a transistor 106, used as a switch to turn on and turn off power from the battery 103 being fed to the Vcc pin. Its gate is pulled up by resistor R1, and can be pulled down by turning on a further transistor 113. In this example, transistor 106 is a P-channel FET while transistor 113 is an N-channel FET (both being enhancement mode devices). An RC circuit sets the voltage of the control electrode (here, gate) of the transistor 113, which is also used as a switch. R2 is provided to pull up the gate of the transistor 113 through the SC line. R2 may be fed through the drain of transistor 106 as shown, or it may be tied directly to Vcc. The RC circuit is connected to the SC line in a series configuration as shown. The SC line is also connected to an inverter 114 that is preferably located on the host side of the battery connector 108 as shown. The inverter 114 is controlled by an output of the host controller 104 (e.g., a GPIO pin). The host controller output operates the inverter 114 so that the latter alternatively pulls up the SC line weakly to Vcc, or pulls the SC line strongly down to GND or essentially the battery's negative terminal.

Figure 2:
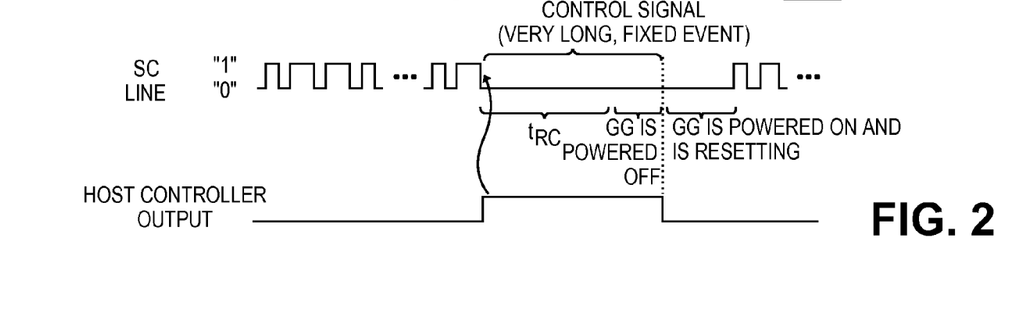
FIG. 2 shows waveforms for selected signals of the embodiment in FIG. 1.

The SC line may thus have two modes of operation, as depicted in the waveforms of FIG. 2. In its normal mode, the SC line switches between different logic levels (as the examples "0" and "1" show) to conduct battery monitoring bus transactions, between the gas gauge circuit 105 and the host controller 104. This mode is maintained by the host controller driving the inverter 114 to thereby pull up the SC line weakly or provide a relatively high impedance to the SC line. In this mode, the host controller is said to deassert a gas gauge reset command on the SC line.

While the SC line is operating in its normal mode, the host controller 104 may suddenly decide that hard reset of the gas gauge circuit 105 is needed, i.e. the gas gauge reset command needs to be asserted on the SC line, because the gas gauge is no longer responding or reporting back to the host controller 104. To do so, the host controller asserts its output to the inverter 114, thereby, in this example, pulling the SC line down strongly to ground. This is depicted in the waveform of FIG. 2. This transition in the SC line may be viewed as the start of the time interval $t_{RC}$ which is a time interval proportional to the time constant of the RC circuit. During this time interval, the voltage at the gate of the transistor 113 starts to drop in accordance with the RC time constant. The voltage drops from a normal "high" level to a "low" level, e.g. smaller than the threshold voltage of transistor 113 so as to turn off transistor 113. The latter action causes the gate voltage of transistor 106 to immediately rise to a sufficiently high level such that transistor 106 is turned off, thereby removing power to the gas gauge circuit 105. This point occurs in the interval indicated in FIG. 2 as "GG is powered off". Thereafter, the host controller output is deasserted at the end of a predetermined interval identified as a "very long fixed event" in FIG. 2. At that point, the SC line is released from GND, thereby allowing the pull up R2 to charge the RC circuit so that the gate voltage of transistor 113 rises back up to its original, high level. The latter, of course, turns the transistor 113 back on, thereby pulling down the gate electrode of transistor 106 to a sufficiently low level as to also turn on the latter transistor, thereby applying power back to the gas gauge circuit 105. In FIG. 2, this is indicated by the time interval described as "GG is powered on and is resetting", because now the gas gauge circuit is undergoing a conventional power-on reset cycle. This may complete the execution of the command of the host controller 104, to perform a hard reset of the gas gauge circuit 105. Normal communications between the host controller 104 and the gas gauge circuit 105 resumes on the SC line following the latter time interval, again as depicted in the waveforms of FIG. 2. Thus, a software-controlled (by the host controller) hard reset of the gas gauge circuit may be achieved, without adding an additional pin to the battery connector 108.

Considering the embodiment of FIG. 1 and the waveform in FIG. 2 again, it should be understood that the reset control circuit 102 removes power to the gas gauge circuit 105, in accordance with a control signal that is asserted on its communications pin SC. In this case, the asserted control signal embodies a "very long" fixed event, namely one where the SC line is kept at the logic "0" level for an interval of time that is on the order of $t_{RC}$. More specifically, the very long fixed event (and hence $t_{RC}$) is selected, by the developer or manufacturer of the battery monitoring circuit, to have a time interval that is longer than the longest logic level that is possible for a transaction on the SC line, in order to distinguish the reset command from normal battery monitoring bus transactions on the line. Thus, the asserted time interval for the reset command (asserted by the host controller on the SC line) should be selected based on the communications protocol used for transactions on the SC line.

Figures 3, 4:
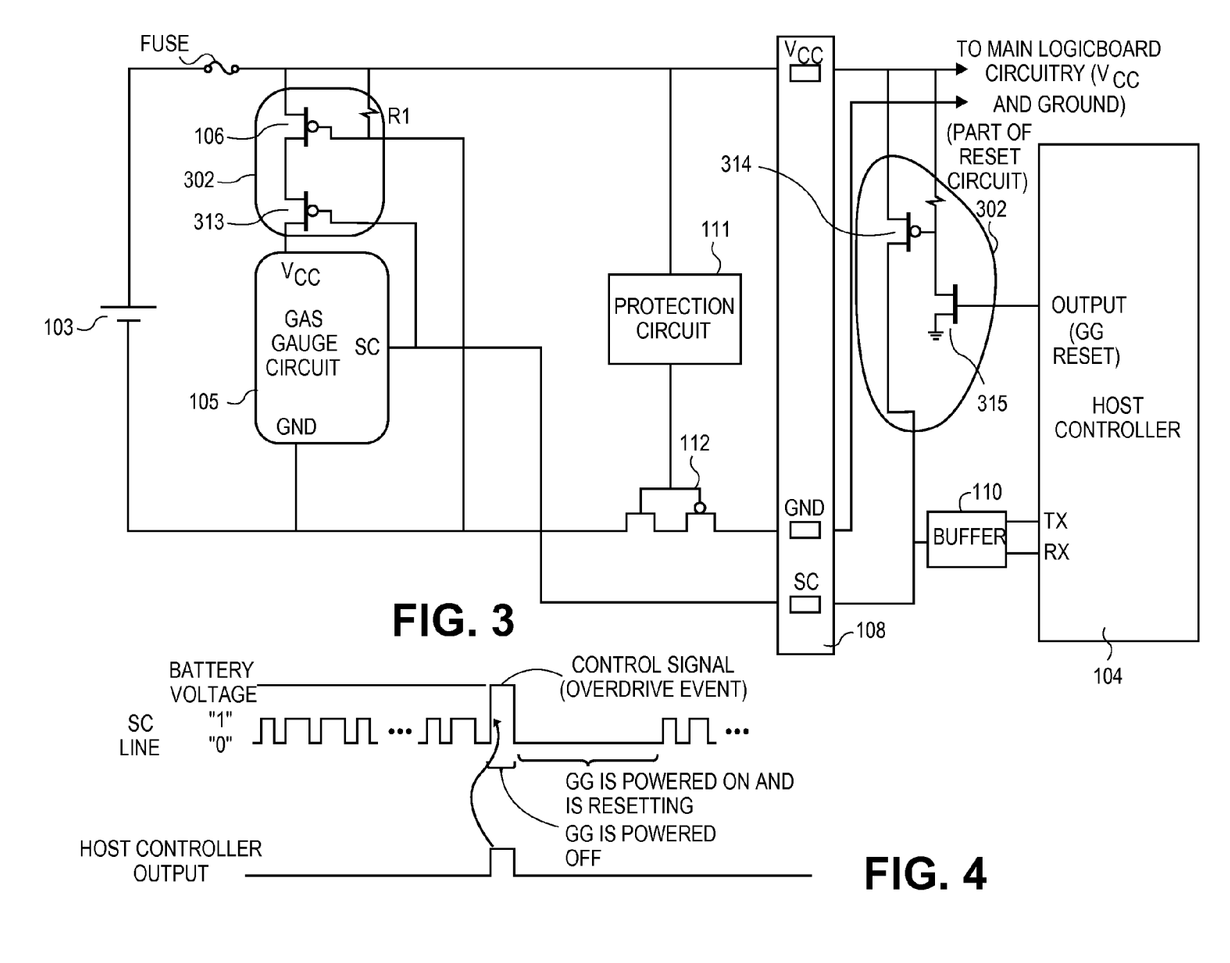
FIG. 3 is a circuit schematic of another embodiment of the reset mechanism.
FIG. 4 shows waveforms of selected signals from the embodiment of FIG. 3.

Turning now to FIG. 3 and FIG. 4, another embodiment of the invention is shown in which the control signal that is asserted on the communications pin SC is of a different type. In particular, the control signal is asserted in this case by overdriving the SC pin above the normal transaction signal swing on the pin. In the example waveforms of FIG. 4, the overdrive event is a pulse that rises to the level of the battery voltage, whereas normal battery monitoring bus transactions on the SC line have a much lower voltage swing as shown. The overdrive event also results in a hard reset of the gas gauge circuit 105, albeit using a different type of reset circuit 302, as depicted in FIG. 3.

Referring to the circuit schematic of FIG. 3, the reset circuit 302 of this embodiment shares the same transistor 106 and pull up resistor R1 of the embodiment of FIG. 1, uses a separate transistor 313 in series with the Vcc pin to alternatively pass or block the current from the battery supply line. The latter transistor 313 is operated as a switch by tying its control electrode to the SC pin or SC line, which after traversing the battery connector 108 is coupled to the drain electrode of a P-channel transistor 314 that is also operated as a switch. The latter transistor is controlled by a N-channel transistor 315 whose gate electrode is driven by the GG reset output pin of the host controller 104. Using such a circuit, the host controller 104 can command a hard reset of the gas gauge circuit 105 over the SC line, by asserting its GG reset output to turn-on transistor 315, which turns-on transistor 314. The latter pulls up the SC line strongly to the Vcc or battery power supply line voltage, thereby turning off the P-channel FET which is the transistor 313. The latter action, of course, cuts off current to the Vcc pin of the gas gauge circuit 105, thereby powering off the gas gauge circuit (see the time interval described as "GG is powered off" in FIG. 4). After a relatively short time interval (which may be based on the hard reset requirements of the gas gauge circuit 105), the host controller deasserts its GG reset output, which starts the time interval described as "GG is powered on and is resetting". Deasserting the output of the host controller reverses the above operations on the transistors 315, 314 and 313, thereby reapplying power back to the Vcc pin of the gas gauge circuit 105. The host controller output thereafter remains deasserted, and the gas gauge circuit 105 upon exiting its power-on reset cycle resumes with its battery monitoring and normal bus transactions on the SC line.

The reset mechanisms described may be incorporated into a battery monitor module 500, such as the one depicted in FIG. 5. The module 500 may have a separate carrier substrate or circuit board, that is to be connected between the battery 103 and a main logic board of the mobile device. The carrier substrate has a supply rail that couples a "+" battery side terminal to a Vcc terminal on the main logic board side, and a return rail that couples a "−" battery side terminal to a GND terminal in the main logic board side. A battery monitor circuit 503 resides on the carrier substrate. The monitor circuit 503 may be the gas gauge circuit 105 described above, with the addition of one or more protection circuits that protect the battery from being discharged to too low of a battery voltage level, by automatically disconnecting the gas gauge circuit or disconnecting the power or supply rails (thereby isolating the battery). The module 500 also has a reset control circuit 504 that is coupled between the communications signal pin SC of the monitor circuit 503 and either the power supply or return rails. In this example, the reset circuit 504 is shown as being able to disconnect the monitor circuit 503 through the latter's GND pin, by breaking the current path from the GND pin to the return rail, in response to the gas gauge reset command being asserted on the SC line.

In yet another embodiment of the invention, the battery monitoring circuitry, which includes the gas gauge circuit 105, the reset circuit 102 or 302, and any additional protection circuits (such as in accordance with the schematic of FIG. 1 or that of FIG. 3, for example), can be implemented entirely on the main logic board side of the battery connector 108. In that case, for purposes of the reset mechanism described here, only the Vcc and GND lines may be needed in the battery connector 108 because the circuit components that make up the reset circuit would essentially reside on the main system or main logic board of the mobile device (located to the right of the battery connector 108, depicted in FIG. 1 and FIG. 3).

Turning now to FIG. 6, this figure shows a view of the front of an example mobile device 200 in which the battery gauge reset mechanism may be implemented. The device 200 shown and described here has similarities to the iPhone™ device by Apple Inc. of Cupertino, Calif. Alternatively, it could be another portable or mobile, handheld multi-function electronic device or smart phone that has some or all of the functionality described below. The device 200 in this case has a fixed, single piece housing, sometimes described as a candy bar or chocolate bar type, in which the primary mechanism for visual and tactile interaction with the user is a touch sensitive display screen 252. An alternative to this type of mobile device is one that has a moveable, multi-piece housing such as a clam shell design or one with a sliding, physical key pad as used by other smart phone manufacturers. The touch screen 252, or in other cases a simple display screen, will display typical smart phone features, such as visual voicemail, web browsing, email functions, digital camera pictures, as well as others. The example in FIG. 6 shows the touch screen 252 displaying the home or main menu of a graphical user interface that allows a user of the device 200 to interact with various application programs that can run in the device 200. The home menu displays icons or graphical images that represent application programs, files, and their associated commands as shown. These may include windows, fields, dialog boxes, menus, virtual buttons, cursors, scrollbars, etc. The user can select from these graphical images or objects by touching the surface of the screen 252 with her finger, in response to which the associated application program will be launched.

The device 200, in this case, also has a wireless telephony function that enables its user to receive and place audio and/or video calls. At the upper end of the housing, an opening 210 is formed through which downlink audio during a call is emitted from an earpiece speaker 220. At a bottom end portion of the device 200, a microphone 216 is located to pickup the near end user's speech, which is then transmitted in an uplink signal to the far end user, during the call. In some cases, the device 200 also has a speakerphone speaker 218 built into the device housing, which allows the user to conduct a call without having to hold the device 200 against her ear. A proximity sensor 254 (see FIG. 7) may be integrated in the mobile device 200, so as to detect proximity of the touch screen 252 to the user's face or head, and thereby automatically disable input through the touch screen 252 during a handset mode call.

Figure 7:
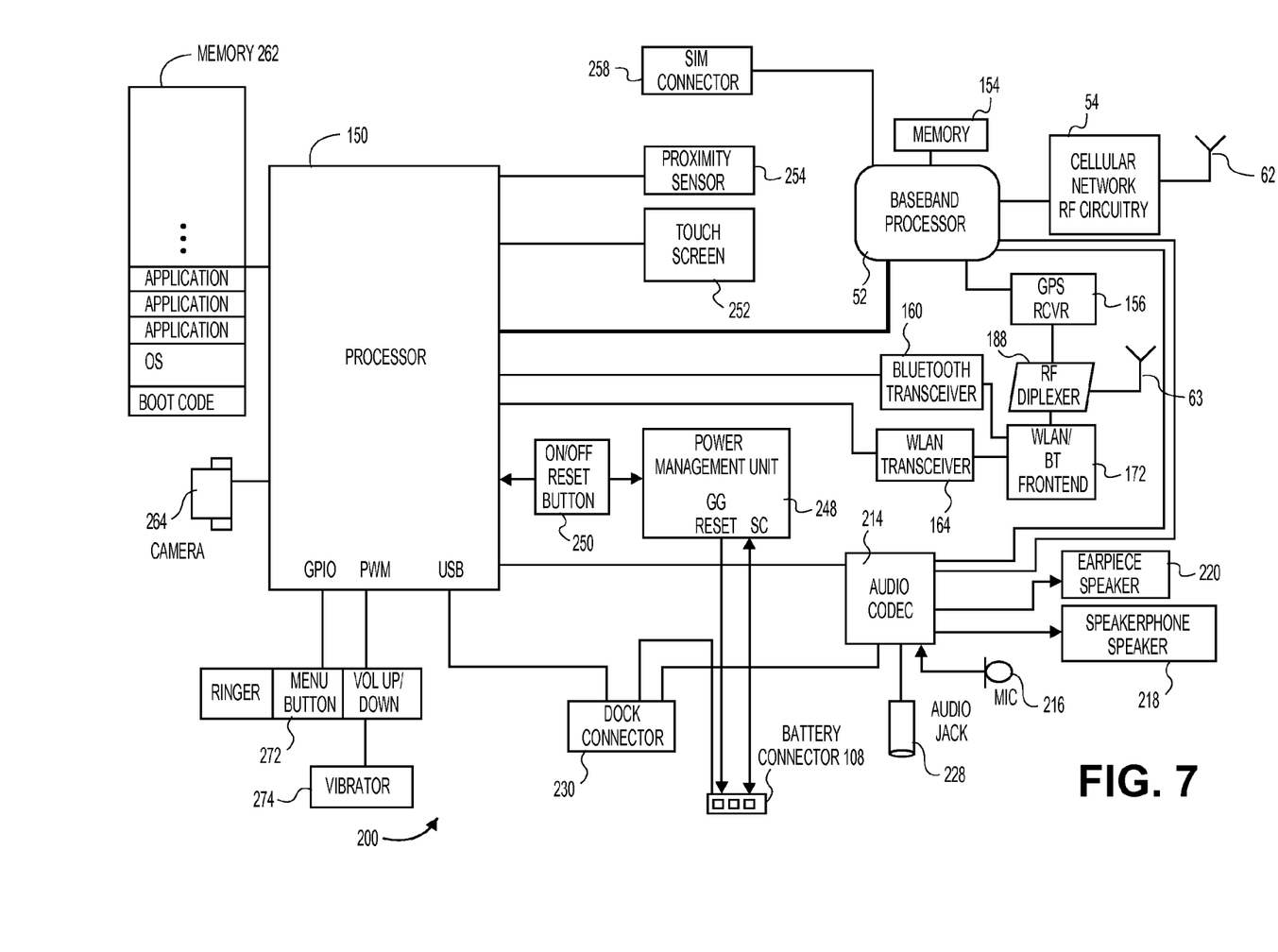
FIG. 7 is a block diagram of some of the electronic functional units that make up the mobile device of FIG. 5.

FIG. 7 depicts an example architecture for the hardware and software components that enable the various functions of the device 200. The device 200 has several built-in electroacoustic transducers, including those introduced above, namely a microphone 216 for pickup of the user's speech, a speakerphone speaker 218, and an earpiece speaker 220. The analog acoustic transducer signal from the microphone 216 is input to an audio codec 214, whereas output audio signals are provided by the codec 214 to the speakers 220, 218. The codec 214 thus acts as an interface to the analog input of the microphone 216 and the analog outputs of the speakers 218, 200, by providing any analog amplification, analog signal conditioning, and analog to digital conversion, as well as digital to analog conversion, as needed to deliver drive signals to the speakers 218, 220 and digitize the pickup signal from the microphone 216. The codec 214 may be a separate IC package.

The codec 214 may be configured to operate in different modes, in accordance with programming or control signals supplied by a processor 150 (also referred to as an applications processor). Communications between the codec 214 and the processor 150 may be over an embedded component bus, such as an I$^2$C bus. In one mode, referred to as media player mode, the device 200 may be operating as a digital media player (e.g., an MP3 player that is playing back music files stored in the device 200). Audio output from the codec 214 in that case may be directed to the speakerphone speaker 218 or an audio jack 228 to which a headset plug (not shown) is connected. In another mode, referred to as call mode, the device 200 is operating as a mobile telephony device, e.g. allowing its user to be in a real-time audio conversation with a far end or remote user. In that mode, the codec 214 may act as an analog pass through, simply forwarding the microphone pickup signal to a base band processor 52 which the latter converts into an uplink signal, and forwarding a downlink signal from the base band processor 52 to the speaker 218 or 220.

The base band processor 52 is part of an interface that receives a downlink signal from and sends an uplink signal to a cellular communications network, using the cellular network RF circuitry 54 and its associated antenna 62. The base band processor 52, which may be a separate IC package, may have a downlink input port and an uplink output port, both of which may be in an intermediate frequency band, e.g. around 26 MHz. Alternatively, the downlink and uplink ports may be at base band frequency range, such that a direct frequency conversion is performed by the RF circuitry 54, relative to the RF carrier frequency at the antenna 62. The antenna 62 is used for long range wireless communications, with the nearest cellular network base station, for example. In short range wireless communications (e.g., in accordance with a Bluetooth protocol and/or a wireless local area network protocol). The antenna 62 may be used to communicate in a 3G or universal mobile telecommunications system, UMTS, band, such as around 850, 900, 1800, and 1900 MHz. The RF circuitry 54 performs the needed down conversion and up conversion, from the UMTS or other cellular network band to the intermediate frequency or base band frequency, at the input or output port of the base band processor 52. The RF circuitry 54 may thus include various active and passive RF signal processing components, including frequency down converter and up converter, RF power amplifiers, and RF filters.

The base band processor 52 may perform known cellular network base band processing tasks, including cellular protocol signaling, coding and decoding, as well as signaling with the external RF circuitry 54. This together with the RF circuitry 54 may be viewed as part of the radio section of the device 200. The base band processor 52 may be programmable, in accordance with software that has been encoded and stored in its associated non-volatile memory 154. Permission to access the cellular network may be granted to the near end user in accordance with a subscriber identify module, SIM, card that is installed in the mobile device 200 to connect with the SIM connector 258.

The device 200 may also have further wireless communications capability, to provide a global positioning system, GPS, service, a Bluetooth link, and a TCP/IP link to a wireless local area network. To this end, a Bluetooth transceiver 160 is provided together with a wireless local area network, WLAN, transceiver 164, which provide additional wireless communication channels for the device 200. These two channels may share an antenna 63 for short range wireless communications (e.g., in accordance with a Bluetooth protocol and/or a wireless local area network protocol). An RF diplexer 188 has a pair of RF ports that are coupled to the antenna 63. One of the RF ports is used for GPS services, which a GPS receiver integrated circuit 156 uses to obtain GPS data that allows the mobile device 200 to locate itself to its user. The other RF port of the diplexer 188 is coupled to an RF front end 172 that combines Bluetooth and WLAN RF signals.

The cellular network, GPS, Bluetooth, and WLAN services may be managed by programming the processor 150 to communicate with the base band processor 52, Bluetooth transceiver 160, and wireless transceiver 164 through separate, component buses. Although not shown, there may also be separate component buses connecting the base band processor 52 to the Bluetooth transceiver 160 and WLAN transceiver 164, to enable the latter transceivers to take advantage of the audio processing engine available in the base band processor 52, to, for example, conduct a wireless voice over IP call (using the WLAN transceiver 164) and to allow the near end user to conduct the call through a wireless headset (using Bluetooth transceiver 160).

The so-called power hungry components of the mobile device 200 may include the base band processor 52, the processor 150, the touch screen 252, and the transmit RF power amplifiers that are part of the RF circuitry 54. These are coupled to be monitored by a power management unit 248. The power management unit 248, which is an example of the host controller 104 described above, may monitor power consumption by individual components of the device 200 and may signal power management commands to one or more of the components as needed so as to conserve battery energy and control battery temperature.

Other lower level hardware and functionality of the mobile device 200 include an on/off or reset button 250, a vibrator 274 used to indicate the ringing signal of an incoming call, an audio ringer, a physical menu button, and a volume up/down button (collectively referred to as circuit elements 272 which may be coupled to output pins of the processor 150 as shown). The mobile device 200 may also have a dock connector 230 that communicates with a USB port of the processor 150, allowing the device 200 to, for example, synchronize certain files of the user with corresponding files that are stored in a desktop or notebook personal computer of the same user. The dock connector 230 may also be used to connect with a power adapter or other electricity source for charging the battery (via the battery connector 108).

In a further embodiment, the mobile device 200 may have digital camera circuitry and optics 264 that are coupled to the processor 250, enabling the mobile device to be used as a digital still or video camera.

Having described the lower level components of the mobile device 200, a brief discussion of the higher level software functionality of the device is in order. As suggested above, the device 200 may be essentially considered to be a computer whose processor 150 executes boot code and an operating system (OS) stored in the memory 262 within the device. Running on top of the operating system are several application programs or modules that, when executed by the processor 150, manage at a high level the following example functions: placing or receiving a call (phone module); retrieving and displaying email messages (mail module); browsing the web (browser module); and digital media playback (iPod™ player module). Additional applications or widgets may be executed by the processor 150, such as those depicted in FIG. 6, including a clock function, SMS or text messaging service application, a weather widget, a calendar application, a street map navigation application, and a music download service application (the iTunes™ service).

The invention is not limited to the specific embodiments described above. For example, a mobile device (in which the reset mechanisms described above can be implemented) need not have the exact hardware and software architecture depicted in FIG. 6 and FIG. 7. In particular, the GG reset input/output pin shown within the power management unit 248 could alternatively be part of another "host controller" in the device 200, e.g. the combination of the processor 150 and memory 262. Accordingly, there are other embodiments within the scope of the claims.

What is claimed is:

1. An electronic circuit for monitoring a battery, comprising:
a gas gauge circuit having a power supply pin, a power return pin, power-on-reset capability, and a battery parameter communications signal pin; and
a reset control circuit coupled between (a) the power supply pin or the power return pin and (b) the communications signal pin, to remove power to the gas gauge circuit in accordance with a control signal asserted on the communications signal pin.

2. The electronic circuit of claim 1 wherein the gas gauge circuit comprises a processor and memory, the memory stores instructions that when executed by the processor (a) monitor energy output of a battery, (b) compute a measure of remaining energy in the battery, and (c) signal the computed measure to a host processor using the communications signal pin.

3. The electronic circuit of claim 2 wherein the communications signal pin is a serial communications protocol signal pin.

4. The electronic circuit of claim 2 wherein the reset control circuit is to remove power to the gas gauge, by cutting off current to the power supply pin from a battery supply line.

5. The electronic circuit of claim 4 wherein the reset control circuit is to assert the control signal on the communications pin by overdriving the communications signal pin, in response to a command from an external processor.

6. The electronic circuit of claim 5 wherein the reset control circuit comprises a transistor switch coupled to pass current from the battery supply line to the power supply pin, a control electrode of the transistor being coupled to the communications signal pin.

7. The electronic circuit of claim 6 wherein the reset control circuit is to overdrive the communications signal pin so that the control electrode reaches a voltage of the battery supply line to thereby the turn off the transistor switch.

8. The electronic circuit of claim 2 wherein the reset control circuit is to remove power to the gas gauge, by cutting off current from the power return pin to a battery return line.

9. The electronic circuit of claim 8 wherein the reset control circuit is to assert the control signal on the communications signal pin, by maintaining a fixed logic low level on the communications signal pin for a time interval that is longer than the longest logic low level for a transaction on the communications signal pin.

10. A battery monitor module, comprising:
a carrier substrate having a supply rail that couples a first battery side terminal to a first main logic board terminal, and a return rail that couples a second battery side terminal to a second main logic board terminal;
a battery monitor circuit on the carrier substrate, the battery monitor circuit having a power supply pin coupled to the supply rail, a power return pin coupled to the return rail, and a communications signal pin, the battery monitor circuit having a processor and memory, the memory stores instructions that when executed by the processor (a) monitor energy output through the supply rail and on that basis compute a measure of remaining battery energy, and (b) signal the computed measure using the communications signal pin; and a reset control circuit coupled between (a) the power supply pin or the power return pin and (b) the communications signal pin, to remove power to the battery monitor circuit in accordance with a control signal asserted on the communications signal pin.

11. The module of claim 10 further comprising a protection circuit coupled to the supply rail, the protection circuit is to disconnect the supply rail or the return rail when voltage on the supply rail drops to a threshold level.

12. The module of claim 11 further comprising a further protection circuit that is to disconnect power to the monitor circuit when voltage on the supply rail drops to a threshold level.

13. A mobile electronic device, comprising:
a battery connector;
a host controller;
a gas gauge circuit having a power supply pin and a power return pin coupled to the battery connector, power-on-reset capability, and a communications signal pin coupled to the host controller; and a reset control circuit coupled between (a) the power supply pin or the power return pin and (b) the communications signal pin, to remove power to the gas gauge circuit in accordance with a control signal asserted on the communications signal pin.

14. The mobile electronic device of claim 13 wherein the gas gauge circuit and the host controller are installed on the same electronic carrier substrate.

15. The mobile electronic device of claim 13 wherein the communications signal pin is coupled to an input/output pin of the host controller, and wherein the reset control circuit is coupled to a further input/output pin of the host controller.

16. The mobile electronic device of claim 15 wherein the host controller is to assert a signal through its further input/output pin as a gas gauge reset command, and wherein the reset control circuit is to respond to the asserted signal by removing power to the gas gauge circuit.

17. The mobile electronic device of claim 15 wherein the gas gauge circuit is to measure battery parameters and send the measured battery parameters to the host controller by performing bus transactions on the communications signal pin in accordance with a serial communications protocol.

* * * * *